United States Patent [19]
Wagner et al.

[11] Patent Number: 4,754,218
[45] Date of Patent: Jun. 28, 1988

[54] CURRENT SENSING APPARATUS

[75] Inventors: Charles G. Wagner, Milford, Del.; Izrail Tsals, Princeton Jct., N.J.

[73] Assignee: Soft Wire Ltd., Milton, Del.

[21] Appl. No.: 703,755

[22] Filed: Feb. 21, 1985

[51] Int. Cl.$^4$ .......... G01R 1/20; G01R 19/10
[52] U.S. Cl. ................. 324/127; 324/117 R
[58] Field of Search ............ 324/117 R, 127, 126, 324/149

[56] References Cited

U.S. PATENT DOCUMENTS

| | | | |
|---|---|---|---|
| 2,134,589 | 10/1938 | Stanek | 324/126 |
| 2,808,566 | 10/1957 | Douma | 324/127 |
| 3,895,296 | 7/1975 | Boyd et al. | 324/127 |
| 4,286,213 | 8/1981 | Fowler | 324/127 |
| 4,307,429 | 12/1981 | Breimesser | 324/117 R |
| 4,314,200 | 2/1982 | Marek | 324/117 R |
| 4,408,175 | 10/1983 | Nelson et al. | 324/127 |
| 4,414,543 | 11/1983 | Schweitzer, Jr. | 324/127 |
| 4,593,276 | 6/1986 | Aida et al. | 324/127 |

FOREIGN PATENT DOCUMENTS

| | | | |
|---|---|---|---|
| 1550613 | 12/1968 | France | 324/127 |
| 0290223 | 10/1971 | U.S.S.R. | 324/127 |
| 0322727 | 10/1972 | U.S.S.R. | 324/127 |

Primary Examiner—Reinhard J. Eisenzopf
Assistant Examiner—W. Burns
Attorney, Agent, or Firm—Sachs & Sachs

[57] ABSTRACT

A current sensing apparatus suitable for sensing the amount of current flowing in a power feeder cable without the necessity for any ohmic connection between the meter and the circuit being measured that does not require separation of the wires in a cable and in fact utilizes both current carrying wires simultaneously includes a magnetically permeable core suitable for concentrating the magnetic fields generated by the current flowing in the pair of wires and includes a single coil disposed upon the core. The core includes a pair of poles which are placed proximate to the feeder cable and the coil yields an induced output voltage proportionate to the current flowing in the feeder cable and may be held in position on the feeder cable with the aid of a resilient member which permits ready removal of the sensing apparatus.

21 Claims, 5 Drawing Sheets

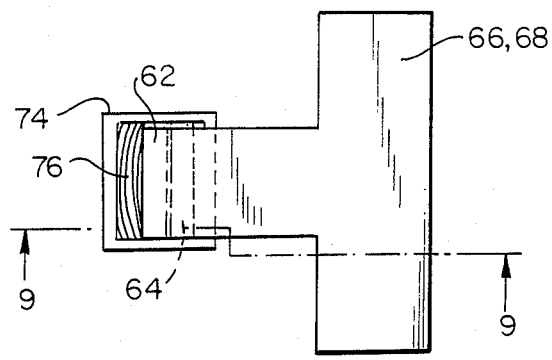
FIG. 8
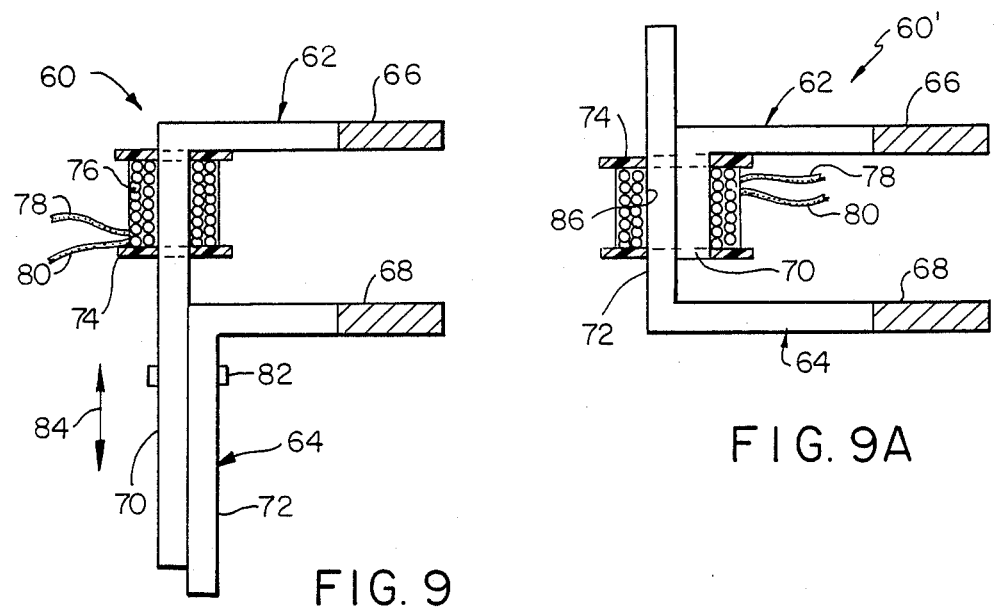
FIG. 9
FIG. 9A
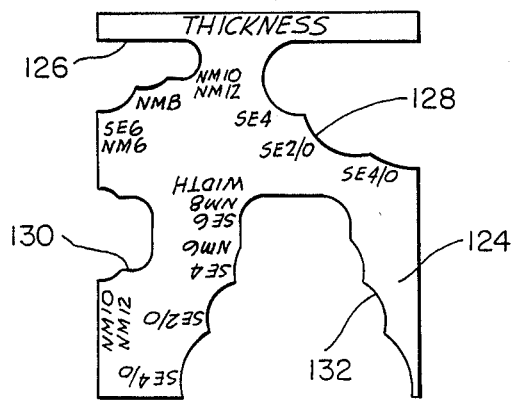
FIG. 12

CURRENT SENSING APPARATUS

BACKGROUND OF THE INVENTION

1. Field of the Invention

This invention relates to a current sensing apparatus, and more particularly, to a current sensing apparatus that does not require any ohmic connection between the sensing apparatus and the feeder cable carrying the current.

The term "ohmic connection" as used herein refers to a direct wire connection, such as by a metal contact probe or clamp as employed in conventional measurement instruments.

2. Description of the Relevant Art

Many devices are available for measuring AC electrical current flowing in an electrically conductive wire. Generally, these instruments are of a split-core current transformer type in which the transformer core is opened and then clamped around an insulated single conductor to measure the current flowing in it. However, portable instruments operable without an ohmic connection have been limited to making current measurements on a single wire (line) since, if the open transformer core encompasses a conductor pair the magnetic field passing through the core will be canceled yielding either no output or an erroneous output.

The most pertinent reference of which we are aware is U.S. Pat. No. 3,056,922 issued to W.E. DuVall, et al on Oct. 2, 1962. The apparatus disclosed therein includes a coil having a magnetic core extending therethrough. A pair of pole pieces are connected to opposite ends of the core and extend, essentially in the form of an L, from the core to the pole tips, which are opposed to one another, and define therebetween an air gap. This air gap is made substantially smaller than one of the conductors in the cable in which the measurement is to be made. Preferably, the current sensor is made sufficiently small to be substantially shielded by one of the conductors from the magnetic field of the other conductors. Means are provided to attach the pick-up head to the cable in which the current is being measured with the air gap extending parallel to one of the conductors. Preferably, the sensing head is positioned with its air gap on a line which passes through the centers of the conductors in the cable under measurement. However, the apparatus disclosed therein was not meant to accurately measure the current flowing in the cable, but rather to provide an induced output voltage which would indicate that current had started to flow and no attempt was made to obtain linearity (ratio constant) between the current flowing in the conductor and the induced voltage in the pick-up coil. The air gap between the pole pieces was made much smaller than the cable to be measured and consequently the magnetic field passing through the core, via the pole pieces, included only the field generated by the current flowing in one of the conductors and made no use of the field formed by the current flowing in the other conductor.

In order to overcome the limitations of the known art and provide a means for providing a directly proportional and constant ratio between induced coil voltage and current flowing in a cable pair the apparatus of the instant invention was conceived.

Therefore, it is an object of the present invention to provide a current sensing apparatus that is capable of measuring current flowing in a pair of wires of a power feeder cable.

It is yet another object of the present invention to provide a current sensing apparatus suitable for portable field use easily attachable to a feeder cable and removable therefrom without requiring ohmic contact.

It is yet another object of the present invention to provide a current sensing apparatus that is accurate, linear, and provides a constant ratio of induced output voltage for current flowing in a cable pair.

It is still yet another object of the present invention to provide a current sensing apparatus that utilizes the magnetic fields generated by current flowing in a pair of wires of a feeder cable to provide an induced output voltage proportioned to the current flowing.

It is still yet another object of the present invention to provide a current sensing apparatus that can accurately measure current flowing in a pair of conductors, has an extended current range and is suitable for use with a plurality of feeder cables just by changing the proportionality (ratio) constant.

It is yet still another object of the present invention to provide an inexpensive current sensing apparatus which may be utilized together with other instruments to provide an accurate power rating for equipment in use.

It is yet further another object of the present invention to provide a sensing apparatus capable of sensing current flowing in a pair of wires in a power feeder cable and provide an output voltage proportionate to the amount of current flowing in the feeder cable.

SUMMARY OF THE INVENTION

A current sensing apparatus suitable for sensing the amount of current flowing in a power feeder cable, according to the principles of the present invention, comprises; a magnetically permeable core suitable for concentrating the magnetic fields generated by a current flowing in a pair of wires in the power feeder cable. The core includes at least two pole pieces and an air gap therebetween sufficiently large to receive the feeder cable wire therebetween. A single coil is disposed upon the core and generates an induced voltage in response to the feeder cable current flow when positioned proximate thereto.

The foregoing and other objects and advantages will appear from the description to follow. In the description reference is made to the accompanying drawing which forms a part hereof and in which is shown by way of illustration a plurality of embodiments in which the invention may be practiced. These embodiments will be described in sufficient detail to enable those skilled in the art to practice the invention, and it is to be understood that other embodiments may be utilized and that structural changes may be made without departing from the scope of the invention. The following detailed description is, therefore, not be taken in a limiting sense, and the scope of the present invention is best defined by the appended claims.

BRIEF DESCRIPTION OF THE DRAWINGS

In order that the invention may be more fully understood, it will now be described, by way of example, with reference to the accompanying drawing, in which:

FIG. 8 is a top plan view of an alternative embodiment, according to principles of the instant invention;

FIG. 9 is a cross-sectional view taken along line 9—9 of FIG. 8;

FIG. 9A is another alternative embodiment similar to that shown in FIG. 9 taken along line 9—9 of FIG. 8 with a slight modification in the core arrangement;

FIG. 12 is a top plan view of a wire thickness gauge which permits an individual to determine the proper current sensing apparatus suitable for use on a particular size feeder cable.

DESCRIPTION OF THE PREFERRED EMBODIMENTS

Figure 1:
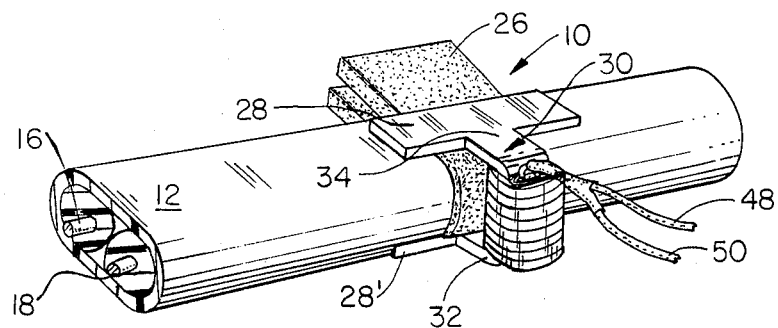
FIG. 1 is an isometric view of the current sensing apparatus, according to the principles of the present invention, placed in position on a power feeder cable.
Figure 2:
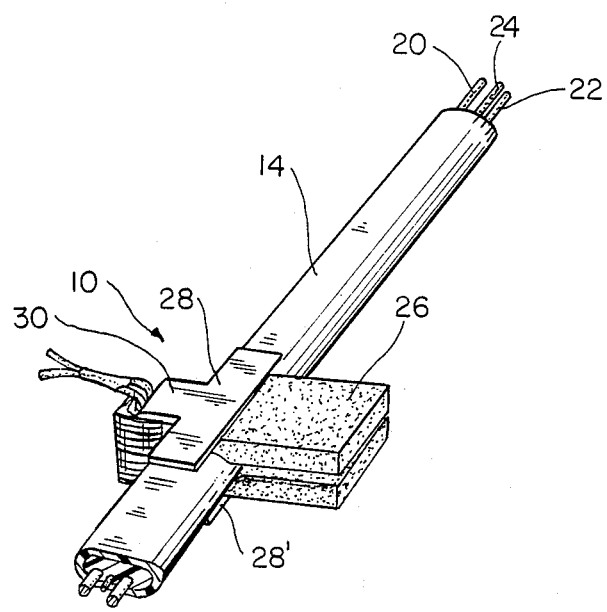
FIG. 2 is an isometric view of a smaller version of the current sensing apparatus, of the instant invention, placed in position on a smaller diameter power feeder cable.
Figure 3:
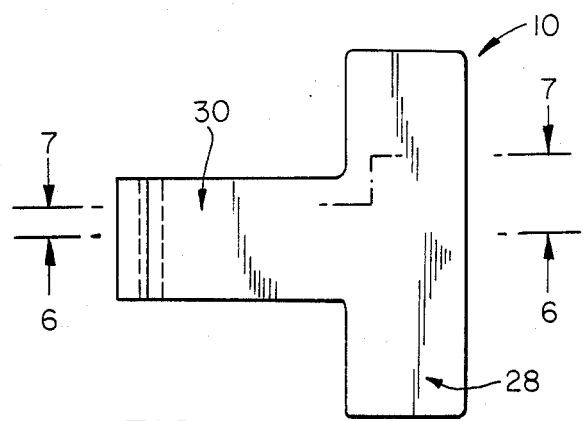
FIG. 3 is a top plan view of the apparatus disclosed in FIG. 1.

Referring now to the Figures, and in particular, to FIGS. 1 and 2 which disclose a current sensing apparatus 10 positioned on a relatively large feeder cable 12, shown in FIG. 1, and on a relatively small feeder cable 14, as shown in FIG. 2. The feeder cable 12 includes two wires 16 and 18, or as shown in FIG. 2, may include three wires 20, 22 and 24, wire 24 being a ground wire which may be included in some feeder cables. Alternatively a braided aluminum shield wire or braid may be utilized (FIG. 7), which would yield the same results as if it were not present, since the aluminum ground braid has no effect on the magnetic fields (magnetic lines of flux) created by current flowing in the conductor wires. With the device of the instant invention it makes no difference whether the AC current flowing is flowing in a wire pair 16 and 18 or pair 20 and 22 since, as will be explained hereinafter, the current sensing apparatus 10 relies on the position of the wire pair within the cable wherein the magnetic fields generated by the current flow in both wires aid or are concentrated (summed) for operation thereof. In order to retain the current sensing apparatus 10 in position on the the power feeder cables 12 and 14 an elongated resilient or sponge like member 26 is placed above and beneath the cable. The current sensing apparatus is slipped thereover compressing the sponge like member 26 and maintaining the transversely extending pole pieces 28 and 28' longitudinally above and below the power feeder cables 12 or 14 essentially parallel to the wires 16, 18 and 20, 24 carrying the load current that is to be measured by the current sensing apparatus 10.

Figure 4:
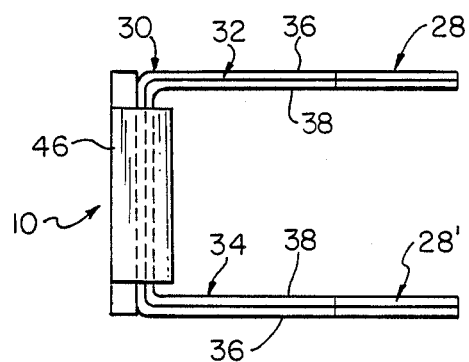
FIG. 4 is a side view in elevation of the apparatus shown in FIG. 1.
Figure 6:
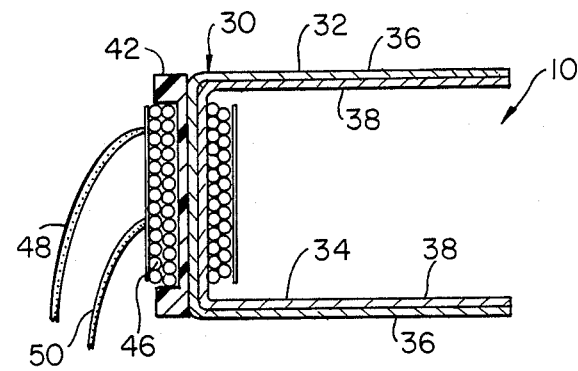
FIG. 6 is a cross-sectional view taken along the line 6—6 of FIG. 3.
Figure 7:
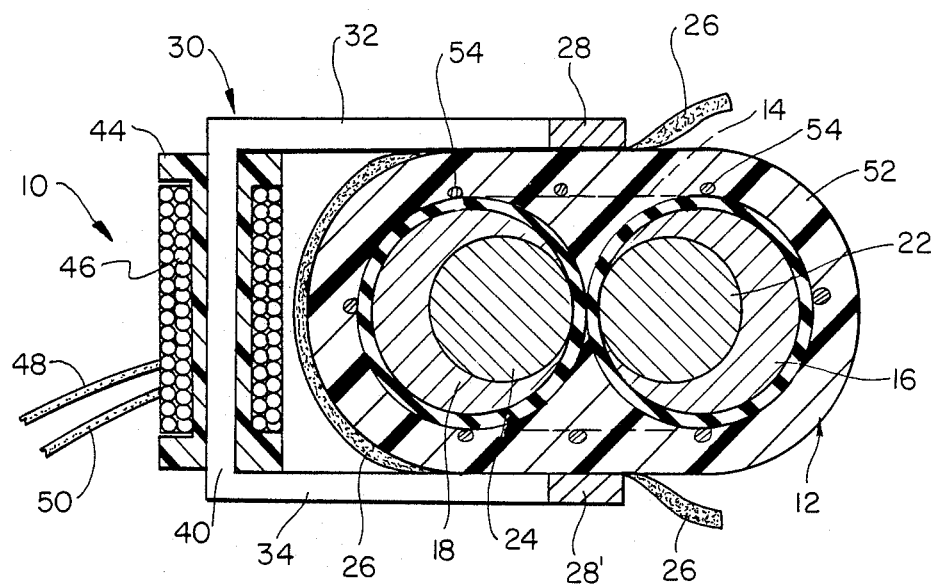
FIG. 7 is an enlarged cross-sectional view taken along the line 7—7 of FIG. 3.

The pole pieces 28 and 28' are disposed transversely from the core member 30 which, when viewed in cross-section, is generally U-shaped with pole pieces 28 and 28' extending transversely from the distal ends of the arms 32 and 34 thereof, best shown in FIGS. 4, 6 and 7.

Figure 5:
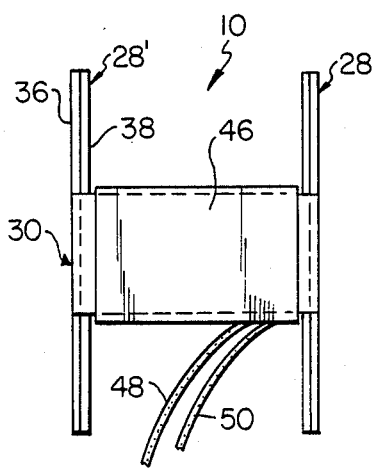
FIG. 5 is an end view of the apparatus shown in FIG. 1.

The core member 30 and its integral pole pieces 28 and 28' may be formed of a single magnetically permeable metal. Preferably, in order the achieve linearity (a constant output voltage for a given current flowing in a cable pair) a laminated core, formed of two dissimilar materials 36 and 38, is utilized (see FIGS. 4, 5 and 6). Core members 36 and 38 are formed so that one core member 36 can be received into the opening of the other core member 38 having an identical configuration. Preferably, this laminated configuration utilizes a core member consisting of one layer of 0.014 inch M5 electrical steel backed with one layer of 0.050 inch conventional steel. The M5 steel was bonded to the backing of the conventional structural steel with an epoxy resin, in a conventional manner. Thus, by bonding 0.014 inch M5 electrical steel on to 0.050 inch thick strip structural steel a satisfactory linear core was fabricated. Whether a single or laminated core is utilized the pole pieces 28 and 28' are positioned parallel to each other and in the same plane as the arms 32 and 34 of the U-shaped core.

Referring now to FIGS. 3, 4, 5 and 6 the laminated construction of the current sensing apparatus 10 becomes readily apparent. The U-shaped core 30 shown in FIG. 4 includes essentially identical core members 36 and 38, generally U-shaped when viewed in cross-section. The central portion 40 of the core member 30 may be provided with a half bobbin 42 as shown in FIG. 6 or a full bobbin 44 as shown in FIG. 7. The full bobbin 44 of course, is provided with a slot sufficiently wide to recline and accommodate the central portion 40 of the core member 30. Thereafter the coil member 46 may be readily wound thereon. The size of wire utilized for the coil member 46 is not critical, since the coil carries very little current. Sufficient turns should be utilized to provide an output induced voltage ratio of between 1 and 2.5 millivolts per ampere flowing in the power feeder cable on which the measurements are to be taken. Thus, with the instant apparatus a high impedance measuring device may be utilized so that the output, leads 48 and 50 of coil member 46 may be coupled to a digital voltmeter or any other type of apparatus which may be calibrated in amperes so that the ratio of millivolts to amperes will remain constant over the desired current range.

Also, as is well known by those knowledgeable in the art, by coupling a fixed AC voltage (equal to that appearing across the current pair) to the device utilized to read the output induced voltage a power reading may be obtained by providing conventional means for multiplying the line voltage times the current flowing in the feeder cable, taking into consideration the power factor thereof, in a conventional manner.

Referring now to FIG. 7 which shows a cross-sectional view of one embodiment of the instant invention affixed to a feeder cable 12 having wires 16 and 18 disposed therein and carrying the current which must be measured by the current sensing apparatus 10 includes an insulating medium or material 52 which surrounds the conductive wires 16 and 18 or may include wires 22 and 24 of a smaller size insulated wire. Although the thickness of the insulated cable or wires may vary the resilient or sponge like member 26 is suitable to fill the gap between the pole pieces 28 and 28' thus positioning the current sensing apparatus 10 and maintaining it on the power feeder cable until the reading is obtained.

It is to be noted that because of a difference in thickness of the insulating material or the distance of the pole pieces 28 and 28' from the conducting wires 22 and 24 as compared to wires 16 and 18 a different ratio (current flowing compared to the induced voltage provided at the output wires 48 and 50 of coil member 46) will be obtained. However, for the same type of cable located in a different position, the same ratio will be obtained and it will be linear over the entire current range of measurement. Some types of power feeder cables include an aluminum braid 54 surrounding the conductive wire. This braid does not interfere with the measurements taken by the current sensing apparatus 10, since the braid does not interfere with the path of the magnetic fields or lines of flux.

In FIGS. 8, 9 and 9A, there is shown an alternative embodiment of the current sensing apparatus 60 which includes a pair of L-shaped core members 62 and 64 that are provided with transverse pole pieces 66 and 68, respectively. One portion 70 of core member 62 has a bobbin 74 disposed thereon, adapted to receive a coil 76 provided with output leads 78 and 80 suitable for coupling to a voltmeter, not shown, in order to read the induced voltage appearing when the current sensing apparatus 60 is applied to a current carrying power feeder cable. The portions 70 and 72 of cores 62 and 64 are slidably clamped with a ring member 82 to enable core 64 to be moved in the direction of arrows 84 for accommodating various sizes of cable which may be placed between the pole pieces 66 and 68 and also provides a constant current to voltage ratio. In the embodiment disclosed in FIG. 9A, portion 70 of core member 62 is cut to be flush with the edge of bobbin 74 and core member 64 is inverted and inserted together with the portion 72 of core member 64 into the opening 86 provided in the bobbin 74, permitting slidable movement between core members 62 and 64, thus permitting pole pieces 66 and 68 to be moved to accommodate various cable feeder sizes and in addition provides a constant induced current to voltage ratio. Here again the transversely disposed pole pieces 66 and 68 are placed upon the feeder cable longitudinally with the conductive wires (parallel therewith), with the feeder cable being disposed therebetween.

Figure 10:
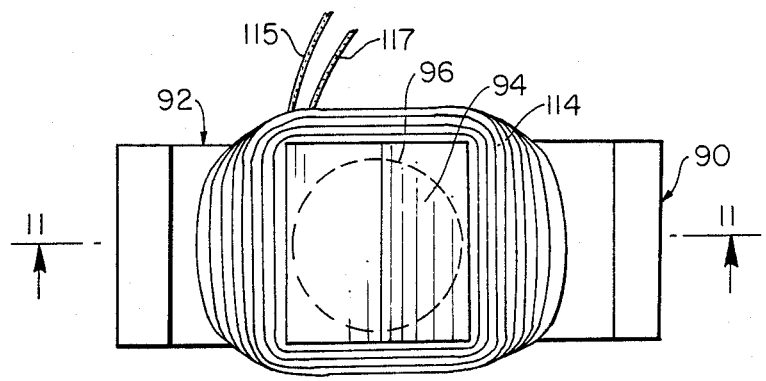
FIG. 10 is a top plan view of yet another alternative embodiment of the instant invention.
Figure 11:
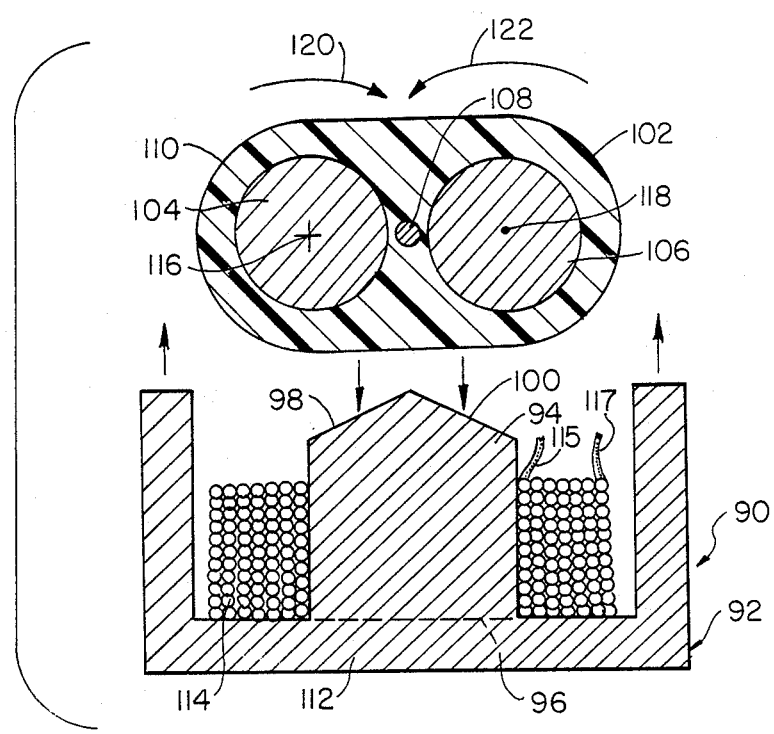
FIG. 11 is a cross-sectional view taken along the line 11—11 of FIG. 10 showing the position of one embodiment of the sensing apparatus in close proximity with a feeder cable.

Refer now to FIGS. 10 and 11 which disclose yet another alternative embodiment of the instant invention. FIG. 10 is a top plan view of a current sensing apparatus 90 which includes a core member 92, generally E-shaped when viewed in cross-section as shown in FIG. 11. The central portion 94 of core member 92 may be an integral portion of the E-shaped lamination or, alternatively, may be comprised a centrally disposed conically shaped portion 96, shown in dotted lines on FIGS. 10 and 11, having sloped surfaces 98 and 100 provided on the outwardly extending distal edges in order to reduce the resistivity of the flux path when the current sensing apparatus 90 is positioned close to the power feeder cable 92, which includes conductive wires 104, 106 and ground wire 108 and the conventional insulating material 110 covering the conductive wires. The central portion 96 may be affixed to the flat portion 112 of core member 92 in a conventional manner. A coil 114 is wound around the central portion 94 or 96, if a conventional manner, providing the required number of turns as indicated earlier, and having two output wires 115 and 117 suitable for affixment to the indicating volt meter to be used to read the induced voltage generated in the coil by current flowing in the wires 104 and 106.

In order to more clearly understand the operation of this embodiment as well as the earlier embodiments let us consider that current is flowing into the paper in wire 104 as indicated by the "+" mark 116 flowing in the opposite direction as indicated by the "dot" 118 provided in wire 106. The aluminum ground wire 108 has little if any effect on the results obtained or on our present discussion. By using the "right hand rule" it can be seen that with current flowing into the paper the flux lines or magnetic field appears in the direction of arrow 120 in wire 104 and with current flowing out of the paper at 118 it can be seen that the flux lines are generated in the direction of arrow 122. (Note: the "right hand rule" states that if the thumb is pointed in the direction of current flow the fingers will depict the direction of the flux lines around a single conductor).

It can seen then that the flux lines generated by the current flowing in wire 104 and the current flowing in wire 106 will aid each other or be more concentrated only in the area directly between the two conductive wires and thus enters the sloped distal edges 98 and 100 of E-core 92 when brought in direct contact with the insulating material 110 of the power feeder cable 102. Thus, the central portion 94, 96 of E-core 92 causes concentration of the aforementioned flux lines providing a return path to the outer edges of the E-core back around to the source. Whether the field or flux lines are generated by AC current flowing in wires 104 and 106 or DC current flowing therein, the flux lines are summed, aided or concentrated in the central portion of the E-core. Thus, if AC current is flowing in a wire pair it will induce a voltage in coil 114 providing an output voltage across wires 115 and 117. In a similar manner, the other embodiments provide for the concentration of the lines of flux generated in the conductive wires by positioning the pole pieces 28 and 28' longitudinally (same direction as the conductive wires) along the power feeder cable thus, concentrating the lines of flux appearing at any instant in time in both wires simultaneously in the core, which then provides the induced voltage proportional to the current flowing in the pair of wires of the feeder cable.

As explained earlier the ratio of AC current flow in the power feeder cable to output voltage induced in the coil may be determined for a particular cable width or size and once determined for the configuration and thickness of the coil and core will remain constant for that particular device. In order to maintain the necessary linearity for a large current range it is necessary to provide a current sensing device that is capable of affixment to various sizes of power feeder cables. Once this ratio is obtained it will be a constant which may be utilized by any computing system as is conventionally known.

In order to enable the operator of the current sensing apparatus to choose the proper constant and/or spacing between the core pole pieces the device or gauge 124 (FIG. 12) may be utilized. The gauge discloses two area ranges for the thickness measurement as indicated by the apertures 126 and 128 which are selected for typical thicknesses of power feeder cables, NM10, NM12; NM8; SE6; and NM6 and cables SE4/0, SE2/0 and SE4, respectively. The width of these cables may be determined from apertures 130 and 132 set forth for the same cables. Thus, once the cable size is determined it may readily be determined which spacing is required for the pole pieces on the current sensing apparatus to be utilized. If a special type of cable not mentioned herein is to be utilized it will be necessary to determine the ratio constant to be utilized by merely permitting a fixed known current to flow in the power feeder cable and determine the actual voltage induced at the voltage coil terminals. Once the proper constant is determined the ratio will remain fixed over the complete current range of the cable. Obviously the output millivolts for accurate reading is a function of the sensitivity of the voltmeter providing the reading and/or the type of instrument to be used, whether it be a power reading device or merely a voltage device calibrated to indicate the amount of current flowing in the power feeder cable pair.

It is well known by those knowledgeable in the art that a Hall effect generator may be inserted in the core in the area where the field or flux lines are concentrated and thereby eliminate or replace the coil therewith and obtain an output voltage proportional to the current flowing in the cable conductors in a manner similar to that taught in the present invention.

Hereinbefore has been disclosed an inexpensive readily attachable and removable current sensing apparatus that provides accurate readings of current flowing in a feeder cable in terms of induced millivolts in a sensing cable and provides a constant which is linear over the range or current carrying capacity of the cable. It will be understood that various changes in the details, materials, arrangement of parts and operating conditions which have been herein described and illustrated in order to explain the nature of the invention may be made by those skilled in the art within the principles and scope of the instant invention.

Having thus set forth the nature of the invention, what is claim is:

1. A current sensing apparatus suitable for sensing the amount of A.C. current flowing in one pair of wires of a power feeder cable, comprising:
   (a) a magnetically permeable core means concentrating the magnetic field lines of flux occurring between said pair of wires generated by a current flowing in said pair of wires of said power feeder cable by centrally disposing said core means between said pair of wires, said core means including;
      (i) at least two pole means, and
      (ii) air gap means, said air gap means being disposed between said pole means and sufficiently large to receive said pair of feeder cable wires therebetween; and
   (b) a single coil means disposed upon said core means for generating an induced voltage in response to said current flow in said pair of wires.

2. A current sensing apparatus according to claim 1 wherein said pole means are disposed transverse to other portions of said core means and are in one plane.

3. A current sensing apparatus according to claim 1 wherein said core means is laminated.

4. A current sensing apparatus according to claim 1 wherein said core means is a single unitary member.

5. A current sensing apparatus according to claim 1 wherein said core means includes two generally L-shaped members.

6. A current sensing apparatus according to claim 5 wherein each said pole means are disposed transverse to said core means.

7. A current sensing apparatus according to claim 5 wherein said coil means includes means for maintaining said two L-shaped core means in sliding relationship.

8. A current sensing apparatus according to claim 7 wherein said coil means includes a bobbin.

9. A current sensing apparatus according to claim 5 further including clamp means for maintaining said two L-shaped cores in sliding relationship.

10. A current sensing apparatus according to claim 1 wherein said coil means includes a bobbin.

11. A current sensing apparatus according to claim 1 wherein said coil means includes a half bobbin.

12. A current sensing apparatus according to claim 1 further including resilient means disposed between said pole means for holding said current sensing apparatus in position on said power feeder cable.

13. A current sensing apparatus according to claim 5 further including resilient means disposed between said pole means for holding said current sensing apparatus in position on said power feeder cable.

14. A current sensing apparatus according to claim 1 wherein said core means is generally U-shaped when viewed on end with said pole means extending perpendicular to the plane of said U-shaped core means.

15. A current sensing apparatus according to claim 1 wherein said core means is generally E-shaped when viewed in cross-section.

16. A current sensing apparatus according to claim 15 wherein said core means includes a plurality of laminated E-shaped sections.

17. A current sensing apparatus according to claim 15 wherein said core means is generally C-shaped and a separate core member means is affixed centrally to said C-shaped member to form said generally E-shaped configuration in cross-section.

18. A current sensing apparatus according to claim 15 wherein the central portion of said E-shaped core member is provided with sloped sides to reduce the reluctance of said magnetic field path.

19. The method of claim 18 further including the step of:
   (e) providing a resilient member disposed between a pair of wires of said feeder cable and said two pole piece means for holding said sensing apparatus in position on said feeder cable.

20. The method of claim 19 further including the step of:
   (f) providing gauge means for determining feeder cable size and a proportionality constant between induced coil voltage and cable current.

21. A method of determining the amount of A.C. current flowing in a pair of wires of a feeder cable, comprising the steps of:
   (a) providing a current sensing apparatus having a magnetically permeable core means including a single coil means disposed on said core means, said core means having at least two pole piece means, said pole piece means,
      (i) extending in one plane,
      (ii) being transversely to other portions of said said core means,
      (iii) being sufficiently spaced apart to receive said feeder cable;
   (b) palcing one of said pole piece means of said current sensing apparatus above and one pole piece means below said feeder cable with said pole piece means extending longitudinally along said feeder cable and centrally disposed between said pair of wires for concentrating magnetic lines of flux generated by said current flowing in said pair of wires; and
   (c) connecting said coil means to a device capable of measuring a voltage induced in said coil means; and
   (d) converting said voltage to a current reading.

* * * * *

UNITED STATES PATENT AND TRADEMARK OFFICE
CERTIFICATE OF CORRECTION

PATENT NO. : 4,754,218
DATED : June 28, 1988
INVENTOR(S) : Charles G. Wagner and Izrail Tsals It is certified that error appears in the above-identified patent and that said Letters Patent is hereby corrected as shown below:

In the Claims:

Claim 19 should be renumbered as Claim 20; and delete the numeral "18" and insert therefor the numeral --19--.

Claim 20 should be renumbered as Claim 21.

Claim 21 should be renumbered as Claim 19.

Claim 21, paragraph (a)(ii) line 1, delete "transversely" and insert therefor --transverse--;

Claim 21, paragraph (b); delete "palcing" and insert therefor --placing--.

Signed and Sealed this

Twentieth Day of December, 1988

Attest:

DONALD J. QUIGG

Attesting Officer

Commissioner of Patents and Trademarks